United States Patent
Santos Rodriguez et al.

(10) Patent No.: US 11,417,528 B2
(45) Date of Patent: Aug. 16, 2022

(54) METHOD OF MANUFACTURING A SEMICONDUCTOR DEVICE AND SEMICONDUCTOR WAFER

(71) Applicant: Infineon Technologies AG, Neubiberg (DE)

(72) Inventors: Francisco Javier Santos Rodriguez, Villach (AT); Roland Rupp, Lauf (DE); Hans-Joachim Schulze, Taufkirchen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/884,442

(22) Filed: May 27, 2020

(65) Prior Publication Data

US 2020/0381256 A1    Dec. 3, 2020

(30) Foreign Application Priority Data

May 27, 2019    (DE) .......................... 102019114140.0

(51) Int. Cl.
| | | |
|---|---|---|
| *H01L 21/26* | (2006.01) | |
| *H01L 29/16* | (2006.01) | |
| *H01L 21/268* | (2006.01) | |
| *H01L 21/02* | (2006.01) | |
| *H01L 29/165* | (2006.01) | |

(52) U.S. Cl.
CPC ...... *H01L 21/268* (2013.01); *H01L 21/02444* (2013.01); *H01L 21/02527* (2013.01); *H01L 29/165* (2013.01); *H01L 29/1608* (2013.01)

(58) Field of Classification Search
CPC ..... H01L 21/02; H01L 21/024; H01L 21/025; H01L 21/02444; H01L 21/02527; H01L 21/26; H01L 21/268; H01L 29/16; H01L 29/165; H01L 29/1608; H01L 21/02002; H01L 21/185
USPC ............................................. 257/77
See application file for complete search history.

(56) References Cited

U.S. PATENT DOCUMENTS

| | | | | |
|---|---|---|---|---|
| 2012/0068161 | A1* | 3/2012 | Lee ........................ | C01B 32/184 257/29 |
| 2015/0132924 | A1* | 5/2015 | Dang ..................... | H01L 21/78 156/247 |
| 2016/0189982 | A1* | 6/2016 | Iguchi .................. | H01L 21/324 438/118 |
| 2016/0351437 | A1* | 12/2016 | Peidous ............ | H01L 21/76251 |
| 2017/0033011 | A1* | 2/2017 | Rupp ..................... | H01L 21/78 |

(Continued)

FOREIGN PATENT DOCUMENTS

| | | |
|---|---|---|
| DE | 102015111453 A1 | 1/2017 |
| DE | 102017127169 A1 | 5/2019 |
| JP | 2004231464 * | 8/2004 |

*Primary Examiner* — Fazli Erdem
(74) *Attorney, Agent, or Firm* — Cooper Legal Group LLC

(57) ABSTRACT

A method of manufacturing a semiconductor device is provided. The method includes forming a carbon structure on a handle substrate at a first surface of the handle substrate. The method further includes attaching a first surface of a semiconductor substrate to the first surface of the handle substrate. The method further includes processing the semiconductor substrate and performing a separation process to separate the handle substrate from the semiconductor substrate. The separation process comprises modifying the carbon structure.

23 Claims, 5 Drawing Sheets

(56) References Cited

U.S. PATENT DOCUMENTS

2019/0157395 A1* 5/2019 Schulze .............. H01L 29/8611
2020/0357637 A1* 11/2020 Rupp ................... B23K 26/402

* cited by examiner

METHOD OF MANUFACTURING A SEMICONDUCTOR DEVICE AND SEMICONDUCTOR WAFER

RELATED APPLICATION

This application claims priority to German Patent Application No. 102019114140.0, filed on May 27, 2019, entitled "METHOD OF MANUFACTURING A SEMICONDUCTOR DEVICE AND SEMICONDUCTOR WAFER", which is incorporated by reference herein in its entirety.

TECHNICAL FIELD

Examples of the present disclosure relate to a method of manufacturing a semiconductor device, wherein the method includes a separation process. Further examples refer to a semiconductor wafer including a plurality of carbon layers.

BACKGROUND

Methods for forming semiconductor devices may include grinding a semiconductor wafer, e.g., to reduce an electrical resistance of the semiconductor device. Grinding can be time consuming and may include high consumption of semiconductor material. This may increase costs for manufacturing the semiconductor devices. For example, no re-use concepts for forming further semiconductor devices using the semiconductor wafer are possible in this case.

Semiconductor wafers may be split so that reuse concepts can be enabled. However, splitting the semiconductor wafer may limit some semiconductor processes required for forming a semiconductor device or may result in defects causing an increase in carrier recombination.

There may be a desire for improved concepts for forming semiconductor devices.

SUMMARY

An example of the present disclosure relates to a method of manufacturing a semiconductor device. The method includes forming a carbon structure on a handle substrate at a first surface of the handle substrate. The method further includes attaching a first surface of a semiconductor substrate to the first surface of the handle substrate. The method further includes processing the semiconductor substrate. The method further includes performing a separation process to separate the handle substrate from the semiconductor substrate, wherein the separation process comprises modifying the carbon structure.

An example of the present disclosure relates to a method of manufacturing a semiconductor device. The method includes forming a material structure on a handle substrate at a first surface of the handle substrate. The material structure comprises a plurality of material regions laterally spaced from one another. The method further includes attaching a first surface of a semiconductor substrate to the first surface of the handle substrate. The method further includes processing the semiconductor substrate. The method further includes performing a separation process to separate the handle substrate from the semiconductor substrate. The separation process comprises modifying the material structure.

An example of the present disclosure relates to a semiconductor wafer. The wafer includes a substrate. A plurality of carbon layers is stacked over each other along a vertical direction perpendicular to a first surface of the substrate. Each of the plurality of carbon layers comprises a plurality of carbon regions laterally spaced from one another. A degree of coverage of the first surface of the substrate with carbon regions of the plurality of carbon layers is greater than 90%.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a wafer composite and of a method of manufacturing a silicon carbide device and together with the description serve to explain principles of the embodiments. Further embodiments are described in the following detailed description and the claims.

DETAILED DESCRIPTION

Figure 1A:
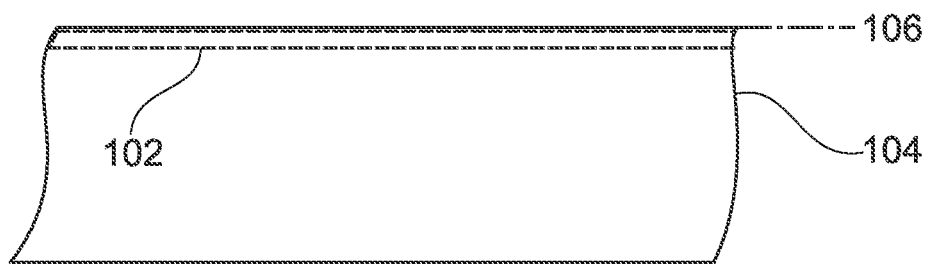
FIGS. 1A to 1E show schematic cross-sectional views of a method of manufacturing a semiconductor device including processing a wafer composite of a semiconductor substrate and a handle substrate.

In the following detailed description, reference is made to the accompanying drawings, which form a part hereof and in which are shown by way of illustrations specific embodiments in which a wafer composite and a method of manufacturing a silicon carbide device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

Ranges given for physical dimensions include the boundary values. For example, a range for a parameter y from a to b reads as $a \leq y \leq b$. The same holds for ranges with one boundary value like "at most" and "at least".

Main constituents of a layer or a structure from a chemical compound or alloy are such elements which atoms form the chemical compound or alloy. For example, silicon (Si) and carbon (C) are the main constituents of a silicon carbide (SiC) layer.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

According to an example, a method of manufacturing a semiconductor device may include forming a carbon structure on a handle substrate at a first surface of the handle substrate. The method may further include attaching a first surface of a semiconductor substrate to the first surface of the handle substrate. The method may further include processing the semiconductor substrate. The method may further include performing a separation process to separate the handle substrate from the semiconductor substrate, wherein the separation process comprises modifying the carbon structure.

The handle substrate may be a crystalline semiconductor substrate. For example, the handle substrate may be a silicon carbide substrate or may comprise a crystalline silicon carbide substrate. For example, the silicon carbide crystal of the handle substrate may have a hexagonal polytype, e.g., 4H or 6H. The handle substrate may be homogeneously doped or may include differently doped SiC layer portions. The handle substrate may include one or more layers from another material with a melting point close to a melting point of crystalline silicon carbide (e.g., a difference between the melting point of the another material and the melting point of crystalline silicon carbide may be less than a threshold difference) and/or with a melting point that is higher than the melting point of crystalline silicon carbide. For example, the layers from another material may be embedded in the crystalline silicon carbide substrate.

The handle substrate may have two essentially parallel main surfaces of the same shape and size and a lateral surface area connecting the edges of the two main surfaces. For example, the handle substrate may be a rectangular prism with or without rounded edges or a right cylinder or a slightly oblique cylinder (e.g., where the sides lean with an angle of at most 8° or at most 5° or at most 3°) with or without one or more flats or notches along the outer circumference.

The handle substrate may laterally extend in a plane spanned by lateral directions (also called "horizontal directions").

Perpendicular to the lateral directions, in a vertical direction, the handle substrate may have a thickness that is small compared to the respective extension of the handle substrate in the lateral directions. The lateral directions may run parallel to the main surfaces or may enclose an angle of at most 10° or at most 8° or at most 5° with at least one of the main surfaces.

In an example, the carbon structure may be formed by any one or any combination of one or more physical vapor deposition (PVD) techniques (e.g., evaporation, sputtering, and/or ion plating), one or more chemical vapor deposition (CVD) techniques, pyrolysis and/or carbonization. The carbon structure may also include one or more patterned layers of carbon arranged over each other, for example. The layers may result in patterned layers by photolithographic patterning of a carbon layer and/or by forming carbon in predefined recesses or trenches, for example. When forming the carbon in predefined recesses or trenches, a surface of the handle substrate may be subject to one or more planarization processes, for example. A further layer may be formed over the carbon structure of the handle substrate, wherein the further layer may be adapted to support the separation process, e.g., by causing mechanical stress upon thermal heating.

Exemplary details on the handle substrate may likewise apply to the semiconductor substrate.

The first surface of the semiconductor substrate may be attached to the first surface of the handle substrate by wafer bonding, for example. For example, the handle substrate and the semiconductor substrate may be connected by direct bonding or by reactive bonding. Adhesion between directly bonded layers and substrates may be based on chemical bonds, hydrogen bonds, metallic bonds, ionic bonds and/or covalent bonds, for example.

Direct bonding may include exerting a physical force pressing the semiconductor substrate and the handle substrate against each other, a thermal treatment of at least one of the bonded surfaces at moderate temperature or a combination of both (e.g., fusion bonding, thermo-compressive bonding, and/or bonding by atomic rearrangement). Direct bonding may include the absence of an additional intermediate layer (and/or any additional intermediate layer), such as the absence of an adhesive layer. A high temperature glue and/or an adhesion layer, e.g., a nitride layer, may be arranged at the interface where the handle substrate and the semiconductor substrate are attached to one another, for example.

Processing the semiconductor substrate may include one or more features of removing a part of the semiconductor substrate, e.g., by a wafer separation process, planarization processes, layer deposition processes, e.g., deposition of an epitaxial drift zone, and/or forming semiconductor device elements in and/or over the semiconductor substrate. The semiconductor device elements may include semiconducting regions, for example p- and/or n-doped regions, insulating layers, for example gate and/or field dielectric(s) and/or interlayer dielectric(s) and conducting layers such as metal layer(s) for contacts and/or wirings, and/or protection and/or passivation layer(s) such as imide. The semiconductor regions, for example a doped drain region, a doped source region, a doped body region, a doped anode region, and/or a doped cathode region, may be formed by ion implantation and/or diffusion from a diffusion source, for example. A planar gate structure including a gate dielectric and a gate electrode or a gate structure including a gate dielectric and a gate electrode in a trench may be formed by thermal oxidation and/or layer deposition of the gate dielectric and layer deposition of a highly doped semiconductor, for example polycrystalline silicon and/or metal layer(s). Thus, processing of the semiconductor substrate at a surface of the semiconductor substrate, for example a front surface of the semiconductor device, may be completed before separating the semiconductor substrate from the handle substrate. Thus, mechanical stability of a semiconductor body comprising the semiconductor substrate and the handle substrate may be utilized during wafer handling when processing the semiconductor elements at a surface of the semiconductor substrate, for example.

The method further includes performing a separation process to separate the handle substrate from the semiconductor substrate, wherein the separation process comprises modifying the carbon structure. For example, the handle substrate may be subjected to the separation process and/or the separation process may be adapted to separate the handle substrate from the semiconductor substrate. Modifying the carbon structure may include changing a regular or irregular pattern of an arrangement of the carbon atoms within the carbon structure. This may be achieved by breaking up the bond between the atoms in the carbon structure. Modifying the carbon structure may include at least one of energy absorption, e.g., absorption of laser radiation for melting or evaporating material of the carbon structure, material removal processes, e.g., one or more etch processes, or oxygen plasma treatment, for example.

According to an example, forming the carbon structure may comprise forming trenches in the handle substrate at the first surface. The trenches may at least partially be filled with carbon. Dimensions, surface area coverage and filling degree of the trenches may be adapted and optimized for separating the handle substrate from the semiconductor layer while achieving a sufficient bonding strength between the semiconductor substrate and the handle substrate, for example.

According to an example, a depth of the trenches may range from 50 nanometers (nm) to 1000 nm, or from 100 nm to 500 nm, and a lateral distance between adjacent two of the trenches may range from 20 nm to 200 nm, or from 40 nm to 150 nm. This may support separating the handle substrate from the semiconductor layer while achieving a sufficient bonding strength between the semiconductor substrate and the handle substrate, for example. For example, the trenches may be arranged in the form of a vast variety of shapes including parallel stripes, grids, and/or separated islands, for example. The carbon structure may also be a continuous structure including openings, e.g., cylindrical openings. A diameter of the openings may be adapted and optimized for allowing a separation of the handle substrate from the semiconductor layer while achieving a sufficient bonding strength between the semiconductor substrate and the handle substrate, for example.

According to an example, forming the carbon structure may comprise at least one of i) heating the handle substrate up to at least 900° Celsius in an inert atmosphere or vacuum, ii) heating a surface part of the handle substrate by absorption of laser radiation, or iii) carbonization of a resist formed on the handle substrate. Each of the measures i) to iii) may support separating the handle substrate from the semiconductor layer.

According to an example, forming the carbon structure may comprise forming a plurality of carbon layers stacked over each other along a vertical direction perpendicular to the first surface, wherein each, one or some of the plurality of carbon layers comprises a plurality of carbon regions laterally spaced from one another. The carbon regions may comprise carbon as a main material (e.g., the carbon regions may consist of carbon except for impurities caused by manufacturing). The plurality of carbon regions of neighboring carbon layers may be laterally shifted with respect to one another (e.g., in a step-like arrangement). A degree of coverage of the first surface of the handle substrate with carbon regions of the plurality of carbon layers may be greater than 90%. This may allow for protecting semiconductor device elements in the semiconductor substrate, e.g., metal wiring, from damage by laser radiation propagating through the handle substrate in the direction of the semiconductor device elements. For example, due to the high coverage, the laser radiation may be absorbed in the carbon regions of the carbon structure instead of irradiating the semiconductor device elements. The carbon regions in the different carbon layers may be arranged with a lateral offset for achieving a desired coverage of the first surface of the handle substrate with carbon regions.

According to an example, forming the carbon structure may comprise forming a carbon layer over the first surface of the handle substrate, wherein the carbon layer covers (e.g., completely covers) the first surface.

According to an example, the method may further comprise forming an adhesion layer (also called "bonding layer") over the first surface of at least one of the semiconductor substrate or the handle substrate, and wherein the adhesion layer has a melting point above 1800° Celsius. The adhesion layer may support attaching the first surface of the semiconductor substrate to the first surface of the handle substrate. For example, a nitride layer, e.g., a silicon nitride layer, may be used as the adhesion layer.

According to an example, the method may further comprise forming trenches in the adhesion layer, and filling the trenches at least partially with carbon. When forming trenches in an adhesion layer over the first surface of the semiconductor substrate, the carbon structure on the handle substrate may be supplemented by another carbon structure on the semiconductor substrate. The carbon structures may be coordinated and aligned for separating the handle substrate from the semiconductor layer while achieving a sufficient bonding strength between the semiconductor substrate and the handle substrate, for example.

According to an example, attaching the first surface of the semiconductor substrate to the first surface of the handle substrate may comprise wafer bonding.

According to an example, processing the semiconductor substrate comprises separating a separation part of the semiconductor substrate from a transfer part of the semiconductor substrate, wherein the transfer part of the semiconductor substrate remains attached to the handle substrate while the separation part is separated (from the transfer part). The separation part may be reused as a substrate in another semiconductor device manufacturing process, for example. After separating the separation part from the transfer part of the semiconductor substrate, one or both of the separating surfaces of the separation part and the transfer part may be flattened, e.g., by one or more polishing processes such as ultra-rapid polishing.

According to an example, the method may further comprise forming one or more semiconductor layers on the transfer part of the semiconductor substrate. The method may further comprise forming semiconductor device elements at a first side of the one or more semiconductor layers. The method may further comprise attaching the one or more semiconductor layers to a support carrier via the first side. The one or more semiconductor layers may be formed on the transfer part after one or more polishing processes for flattening a separation surface of the transfer part, for example. The number, doping concentration and thickness as well as other characteristics of the one or more semiconductor layers may be adapted to target device parameters of the semiconductor device, e.g., breakdown voltage or blocking voltage. The one or the more semiconductor layers may correspond to or include at least one of a drift zone, a buffer zone, or a drain zone of the semiconductor device, for example. The support carrier may be chosen, e.g., with respect to material and dimensions, in view of the mechanical stress caused by separating the handle substrate from the semiconductor substrate and in view of the mechanical stability required for further processing the transfer part of the semiconductor substrate after the separation process, for example. The support carrier may be a so-called reversible carrier. That is to say, after processing the semiconductor layers and/or the semiconductor substrate with the support carrier attached to the semiconductor layers, the support carrier may be removed without damaging or destroying the semiconductor layers.

According to an example, the method further comprises, before attaching the first surface of the semiconductor substrate to the first surface of the handle substrate, modifying a crystal structure of the semiconductor substrate at an interface between the separation part and the transfer part of the semiconductor substrate by at least one of i) ion implantation of impurities and heating, or ii) absorption of laser radiation. Ion implantation of impurities, e.g., protons, may cause accumulation of hydrogen and/or vacancies at an end-of-range of the implantation. During the heat treatment, the H-implant evolves into highly pressurized H2 gas bubbles and/or vacancy agglomeration-induced cavities, which may in either case grow in size and ultimately lead to a crack propagation throughout the whole hydrogen-implanted semiconductor substrate. This may allow for separating the separation part from the transfer part of the semiconductor substrate, for example. Absorption of laser radiation may also allow for a separation of the separation part from the transfer part of the semiconductor substrate. For example, absorption of the laser radiation may be adjusted at a desired depth in the semiconductor substrate by forming a buried absorption layer in the semiconductor substrate, e.g., by implanting ions into the semiconductor substrate that allow for a selective absorption with respect to a material of the semiconductor substrate and/or that result in change of the crystal structure of the semiconductor substrate in the region of the implanted ions, and thus to a change in band gap. For example, a thickness of the absorption layer may be at least 30 nm (or at least 50 nm, at least 100 nm, at least 200 nm, or at least 300 nm) and/or at most 1500 nm (or at most 750 nm, at most 500 nm, or at most 400 nm).

According to an example, modifying the carbon structure may be caused by at least one of i) absorption of laser radiation in a carbon material (e.g., in carbon regions) of the carbon structure, ii) one or more etch processes, or iii) oxygen plasma treatment.

In the case of absorbing laser radiation in the carbon structure (and/or in the case of absorbing laser radiation in an absorption layer within the semiconductor substrate), the following may apply. The laser radiation may be absorbed in and decompose material (e.g., decompose the chemical bonds) of carbon material of the carbon structure (or of the material of the absorption layer, respectively). For example, a peak wavelength of the laser radiation may be at least 340 nm (or at least 500 nm, or at least 650 nm, or at least 1.0 micrometers ($\mu$m), or at least 1.25 $\mu$m, or at least 1.5 $\mu$m) and/or at most 3.7 $\mu$m (or at most 2 $\mu$m, or at most 1.6 $\mu$m, or at most 1.1 $\mu$m, or at most 750 nm). In a typical example, the peak wavelength may be at least 340 nm and at most 600 nm or at least 1000 nm and at most 1200 nm. The peak wavelength may be chosen such that a ratio of the absorption coefficients of the semiconductor substrate and of the carbon structure (or the absorption layer, respectively) at the peak wavelength is high (e.g., maximized). The peak wavelength may correspond to the bandgap of the carbon material within the carbon structure (or of the absorption layer, respectively), for instance within an accuracy of ±1 GHz. In a typical example, the peak wavelength should be low enough to ensure energy deposition into the carbon structure (or the absorption layer, respectively), but high enough to allow for high transmission in the material outside the carbon structure (or the absorption layer, respectively). For example, the laser radiation may be pulsed or continuous or quasi-continuous (i.e., with a pulse length of above 1 microsecond ($\mu$s)) and/or focused or unfocused. Using focused light may allow for higher selectivity of energy deposition within the carbon structure (or the absorption layer, respectively). Using unfocused laser light may enable reducing a complexity of an optical system for guiding the laser radiation to the carbon structure (or the absorption layer, respectively). Energy, wavelength, and focus size—and, if applicable, pulse length and repetition rate—of the laser radiation may be appropriately matched in order to allow for sufficient energy deposition within the carbon structure (or the absorption layer, respectively). In some examples, a pulse length of the laser radiation may be at most 100 nanoseconds (ns) or even at most 10 ns. In this case, an energy of the laser radiation may be at least 0.1 nanojoules (nJ) or at least 1 nJ or at least 100 nJ or at least 1 millijoules (mJ) and/or at most 100 mJ or at most 10 mJ.

For example, the laser radiation may be irradiated onto the carbon structure through the handle substrate. The semiconductor substrate may comprise semiconductor device elements that are opposite the handle substrate with respect to the carbon structure. Laser radiation that impinges on the semiconductor device elements could damage or even destroy at least part of the semiconductor device elements. It may be possible to prevent such a damage by minimizing absorption and/or energy deposition within the semiconductor device elements by at least one of the following measures: (i) providing the carbon structure such that a degree of coverage of the first surface of the substrate with carbon regions of the plurality of carbon layers is greater than 90%; (ii) focusing the laser radiation to the carbon structure with a high numerical aperture such that the semiconductor device elements are far out-of-focus; (iii) choosing the peak wavelength of the laser radiation such that an absorption within the semiconductor device elements is minimized; or (iv) choosing a pulse length and an energy of the laser radiation such that a peak energy at the carbon structure is sufficient to modify the material of the carbon structure and such that a peak energy at the semiconductor device elements is sufficiently reduced due to dispersion within the handle substrate and/or within the semiconductor substrate to avoid damage of the semiconductor device elements.

According to an example the separation process may further comprise at least one of i) heating the handle substrate, ii) applying mechanical force and/or stress to the handle substrate, or iii) ultrasonic treatment of the handle substrate. Each of the process features i) to iii) may support separating the handle substrate from the semiconductor substrate, e.g., by triggering a crack propagation along a separation interface at or close to (e.g., within a threshold distance of) the carbon structure. The mechanical stress and/or force may be applied for example by the deposition of a layer (e.g., polyimide) with an expansion coefficient different to the underlying material and for example in combination with cooling this stack.

According to an example of a method of manufacturing a semiconductor device, the method may include forming a material structure on a handle substrate at a first surface of the handle substrate. The material structure may comprise a plurality of material regions laterally spaced from one another. The method may further comprise attaching a first surface of a semiconductor substrate to the first surface of the handle substrate. The method may further comprise processing the semiconductor substrate. The method may further comprise performing a separation process to separate the handle substrate from the semiconductor substrate, wherein the separation process comprises modifying the material structure. For example, the material structure may include at least one of carbon, a ternary carbide, or a ternary nitride. Details provided above with respect to similar process features likewise apply.

According to an example, the semiconductor substrate may be a silicon carbide (SiC) substrate. For example, the silicon carbide crystal of the SiC substrate may have a hexagonal polytype, e.g., 4H or 6H. The SiC substrate may be homogeneously doped or may include differently doped SiC layer portions. The SiC substrate may include one or more layers from another material with a melting point close to a melting point of crystalline silicon carbide (e.g., a difference between the melting point of the another material and the melting point of crystalline silicon carbide may be less than a threshold difference) and/or with a melting point that is higher than the melting point of crystalline silicon carbide. For example, the layers from another material may be embedded in the crystalline silicon carbide substrate.

The examples described above may be examples for manufacturing a power semiconductor device, e.g., a silicon carbide power semiconductor device. The power semiconductor device or an electrical structure (e.g., transistor of the silicon carbide device) of the power semiconductor device may have a breakdown voltage or blocking voltage of more than 100 V (e.g., a breakdown voltage of 200 V, 300 V, 400 V or 500 V) or more than 500 V (e.g., a breakdown voltage of 600 V, 700 V, 800 V or 1000 V) or more than 1000 V (e.g., a breakdown voltage of 1200 V, 1500 V, 1700 V, 2000 V, 3300 V or 6500 V), for example.

According to an example a semiconductor wafer may comprise a substrate. The semiconductor wafer may further comprise a plurality of carbon layers stacked over each other along a vertical direction perpendicular to a first surface of the substrate. Each of the plurality of carbon layers may comprise a plurality of carbon regions laterally spaced from one another. A degree of coverage of the first surface of the substrate with carbon regions of the plurality of carbon layers is greater than 90%. The carbon regions in the different carbon layers may be arranged with a lateral offset for achieving a desired of coverage of the first surface of the handle substrate with carbon regions. Successive carbon regions along a lateral direction may be arranged in different carbon layers. This may result in a repetitive step-shaped arrangement of the carbon regions, for example.

According an example of the semiconductor wafer at least some of the carbon regions are embedded in a nitride layer. The nitride layer may be used as an adhesion layer when bonding the semiconductor wafer to another wafer, for example. The carbon layers may be used as an absorption layer for separating the semiconductor wafer from another wafer, for example.

According an example wherein the handle substrate is one of a 4H SiC wafer, a 6H SiC wafer, a 15R SiC wafer, or a poly SiC wafer.

The examples and features described above and below may be combined.

Some of the above and below examples are described in connection with a silicon carbide substrate. Alternatively, a wide band gap semiconductor substrate, e.g., a wide band gap wafer, may be processed, e.g., comprising a wide band gap semiconductor material different from silicon carbide. The wide band gap semiconductor wafer may have a band gap larger than the band gap of silicon (1.1 electron volts (eV)). For example, the wide band gap semiconductor wafer may be a silicon carbide (SiC) wafer, or gallium arsenide (GaAs) wafer, or a gallium nitride (GaN) wafer.

More details and aspects are mentioned in connection with the examples described above or below. Processing the wide band gap semiconductor wafer may comprise one or more optional additional features corresponding to one or more aspects mentioned in connection with the proposed concept or one or more examples described above or below.

The aspects and features mentioned and described together with one or more of the previously described examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles and the concepts of the present disclosure. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

FIGS. 1A to 1E illustrate a method for manufacturing a semiconductor device.

Referring to FIG. 1A, a carbon structure 102 is formed on a handle substrate 104 at a first surface 106 of the handle substrate 104. The carbon structure 102 and the handle substrate 104 may be formed as described in any of the examples above. In view of the various possibilities of forming the carbon structure, e.g., inter alia, continuous or patterned carbon layer, stack of patterned carbon layers, carbon fillings in trenches, the carbon structure 102 is schematically illustrated by a dashed box in some of the figures.

Figure 1B:
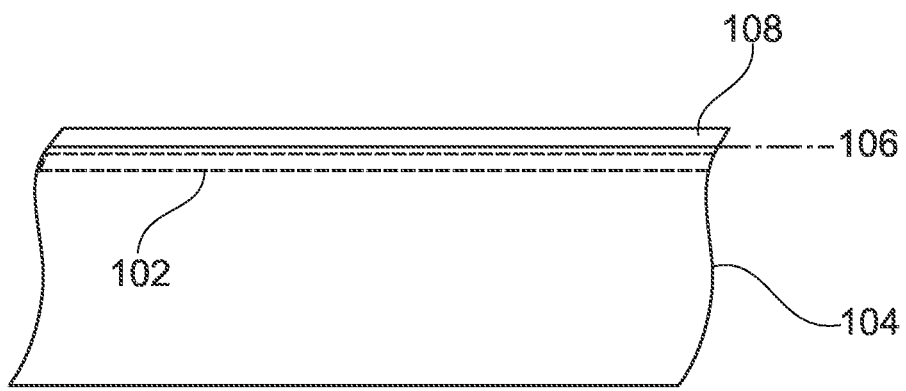

Referring to FIG. 1B, an optional adhesion layer 108 is formed on the carbon structure 102. The adhesion layer 108 may be formed as described with reference to the examples above, for example.

Figure 1C:
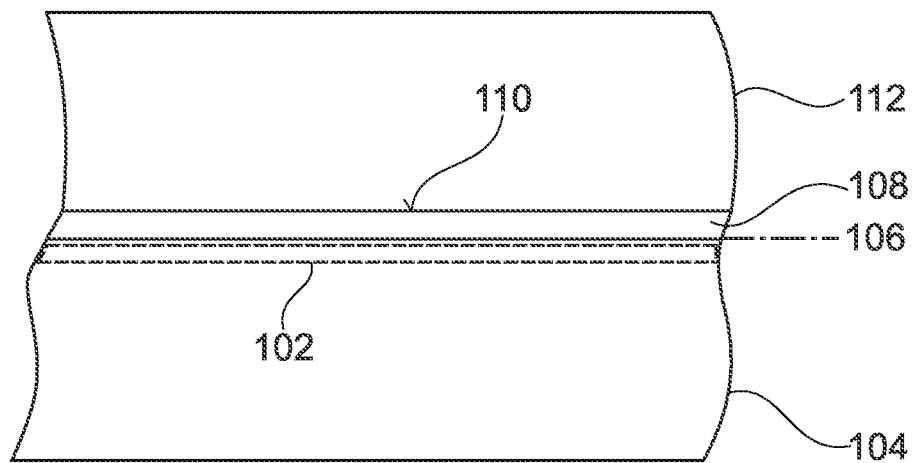

Referring to FIG. 1C, a first surface 110 of a semiconductor substrate 112 is attached to the first surface 106 of the handle substrate 106. The semiconductor substrate 112 may be formed as described with reference to the examples above, and be attached to the handle substrate 104 as described with reference to the examples above, for example.

Figure 1D:
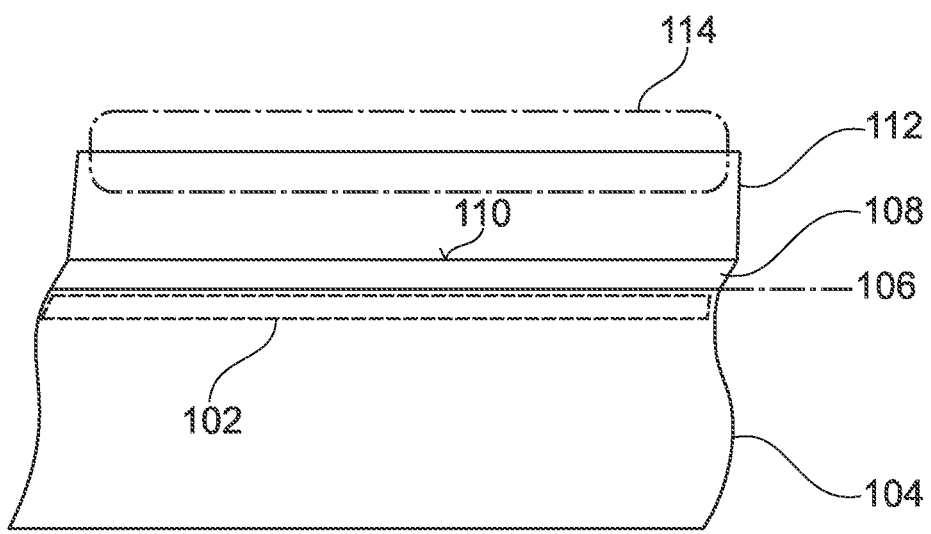

Referring to FIG. 1D, the semiconductor substrate 112 is processed. Processing of the semiconductor substrate 112 may be carried out as described with reference to the examples above, including, inter alia, at least one of separating a separation part from a transfer part of the semiconductor substrate or forming semiconductor device elements in the semiconductor substrate. In view of the various possibilities of processing the semiconductor substrate 112, semiconductor device elements 114 are schematically illustrated by a chain dotted line in some of the figures.

Figure 1E:
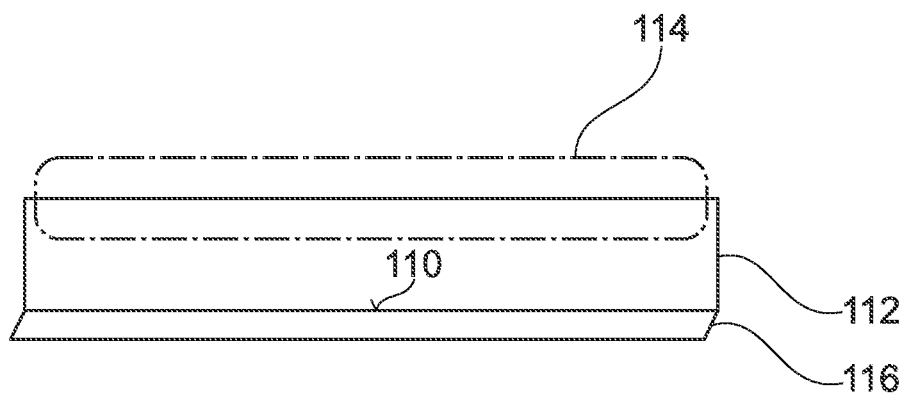

Referring to FIG. 1E, the handle substrate 104 is subjected to a separation process adapted to separate the handle substrate 104 from the semiconductor substrate 112, wherein the separation process comprises modifying the carbon structure. The separation process as well as the modification of the carbon structure 102 may be carried out as described with reference to the examples above.

Further referring to FIG. 1E, the semiconductor substrate 112 is processed at the first surface 110, e.g., a rear side of the semiconductor device where the handle substrate 104 has been split off. Processing of the semiconductor substrate 112 at the first surface 110 may include processes for surface treatment, e.g., polishing, ion implantation processes, e.g., for forming highly doped contact regions, drain or collector regions, or field stop zones, metallization processes, e.g., for forming a rear side contact. Processing the semiconductor substrate 112 at the first surface 110 may result in semiconductor device elements 116, e.g., at least one of rear side contacts, highly doped semiconductor contact regions, drain/collector regions, or field stop zones.

Figure 2A:
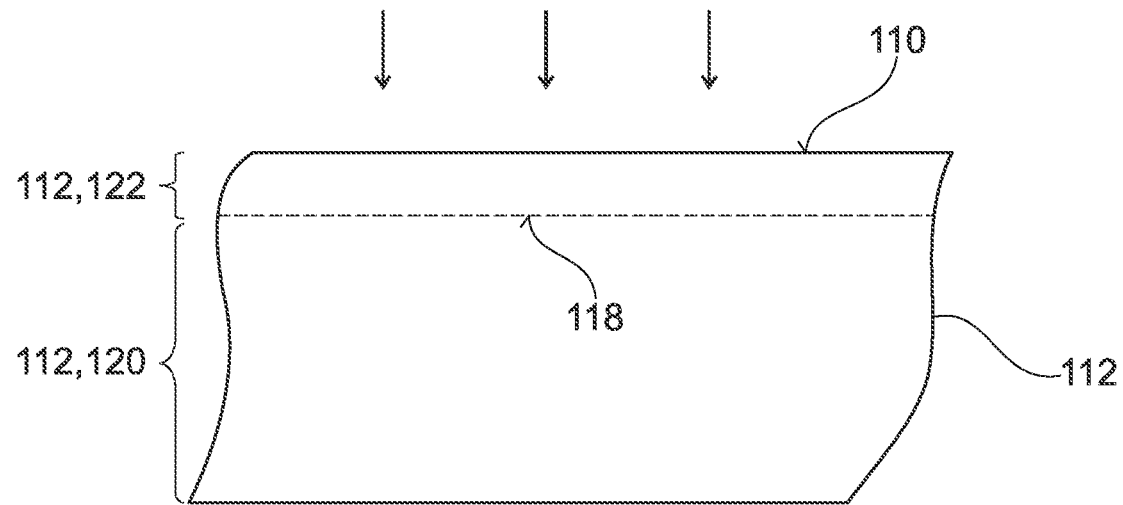
FIGS. 2A to 2D as well as FIGS. 3A to 3C illustrate exemplary process features that may be integrated in the method illustrated in FIGS. 1A to 1E.

FIG. 2A illustrates an exemplary process carried out before attaching the first surface 110 of the semiconductor substrate 112 to the first surface 106 of the handle substrate 104. A crystal structure of the semiconductor substrate 112 at an interface 118 between a separation part 120 and a transfer part 122 of the semiconductor substrate 112 is modified by ion implantation of impurities. For example, the interface 118 corresponds to or is close to an end of range peak of the implanted ions.

Figure 2B:
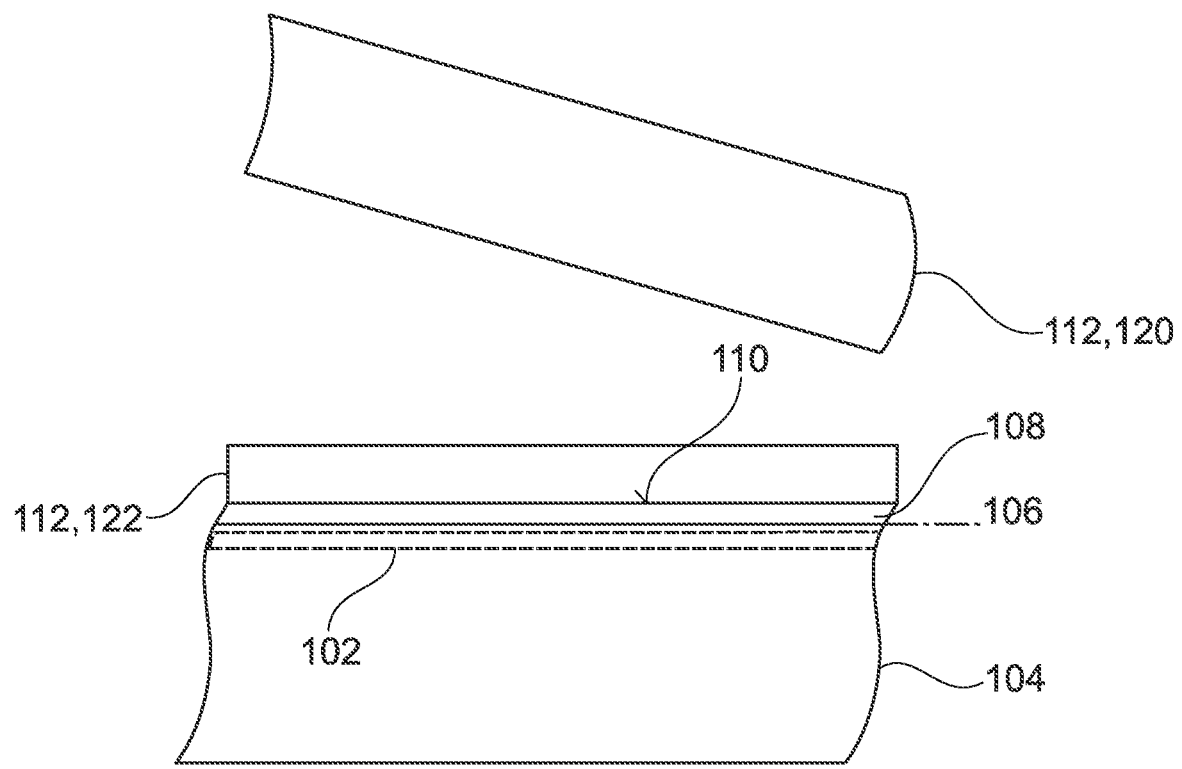

FIG. 2B illustrates an exemplary process during processing of the semiconductor substrate 112 that may be carried out after attaching the first surface 110 of the semiconductor substrate 112 to the first surface 106 of the handle substrate 104. Heating, and/or absorption of laser radiation may initiate the separation of the separation part 120 of the semiconductor substrate 112 from the transfer part 122 of the semiconductor substrate 112. The separation part 120 may be reused as a substrate for further semiconductor device manufacturing processes.

Figure 2C:
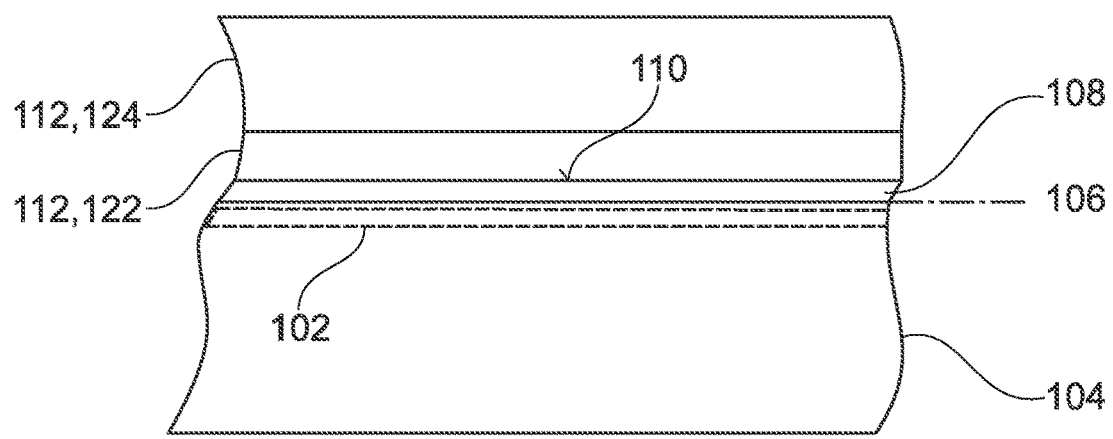

FIG. 2C illustrates an exemplary process during processing of the semiconductor substrate 112 that may be carried out after attaching the first surface 110 of the semiconductor substrate 112 to the first surface 106 of the handle substrate 104. One or more semiconductor layers 124 are formed on the transfer part 122 of the semiconductor substrate 112. The one or more semiconductor layers 124 may correspond to or include a drift zone of the semiconductor device, for example. Further processing of the semiconductor substrate 112 may be carried out, e.g., formation of semiconductor device elements 114, leading to a semiconductor substrate as is illustrated in the schematic view of FIG. 1D.

Figure 2D:
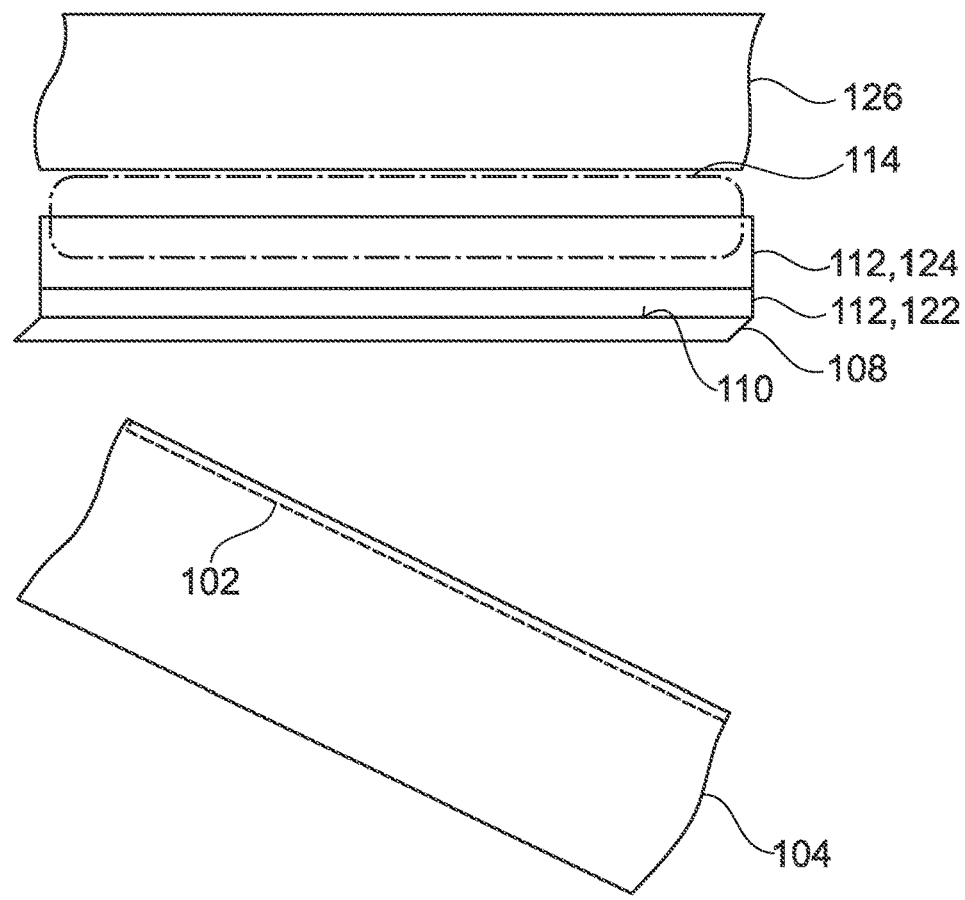

FIG. 2D illustrates an exemplary process during processing of the semiconductor substrate 112 that may be carried out after attaching the first surface 110 of the semiconductor substrate 112 to the first surface of the handle substrate 104. A support carrier 126 is attached to the one or more semiconductor layers 124, and, thereafter, the handle substrate 104 may be separated from the semiconductor substrate 112 by a separation process comprising modifying the carbon structure 102 as described in the examples above. For example, after modifying the carbon structure 102, the carbon structure 102 may be at least partially destroyed and/or may comprise cracks along which the separation process occurs.

After separating the handle substrate 104 from the semiconductor substrate 112, residuals of the carbon structure 102 that might remain at the semiconductor substrate 112 (e.g., at the adhesion layer 108 formed over the first surface of the semiconductor substrate 112) might be removed, e.g., with at least one of: grinding, chemical removal (e.g., etching or chemical mechanical planarization (CMP)), or plasma treatment (e.g., plasma etching). In some examples, the adhesion layer 108 may be removed in the same process act as the residuals of the carbon structure 102. In other examples, the adhesion layer 108 may be removed in a later process act, optionally with one of the methods used for removing the residuals of the carbon structure 102. In addition or as an alternative, residuals of the carbon structure 102 that might remain at the handle substrate 104 may be removed, e.g., with one of the methods mentioned before in connection with the residuals at the semiconductor substrate 112.

Figure 3A:
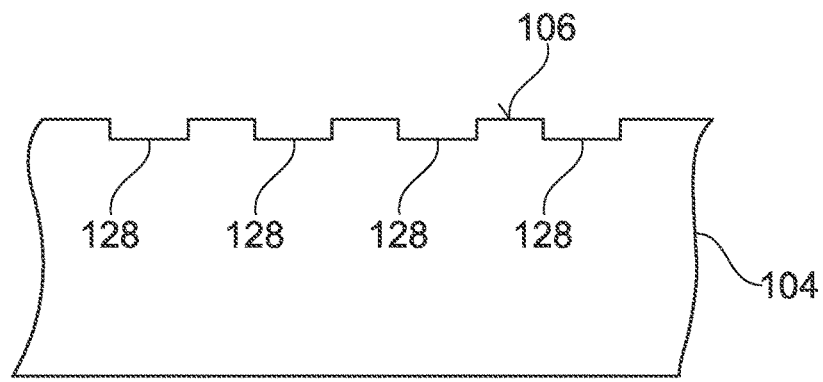
Figure 3B:
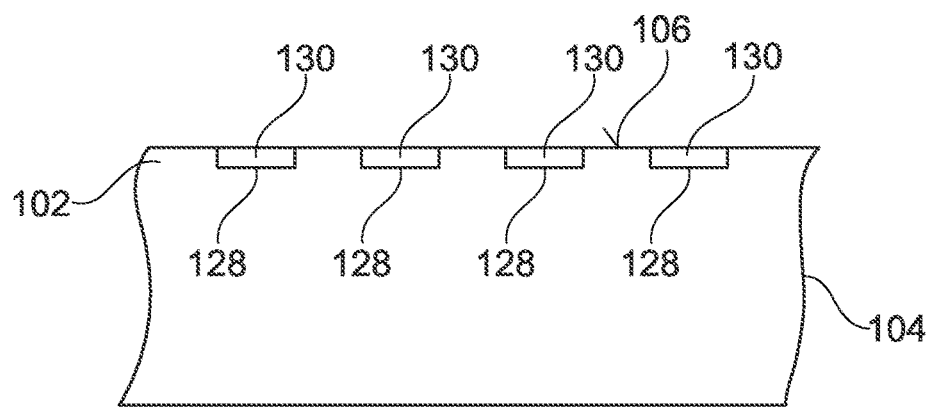

FIGS. 3A and 3B exemplifies the process of forming the carbon structure 102 by carrying out the processes of forming trenches 128 in the handle substrate at the first surface 106 of the handle substrate 104, and filling the trenches 128 at least partially with carbon 130. Further details on forming the trenches 128 and filling the trenches 128 with carbon 130 are described with reference to the examples above. As an alternative or in addition to carbon 130, also other materials configured to support the separation process may be used, e.g., a ternary carbide and/or a ternary nitride. Instead of filling the carbon 130 into the trenches 128, a carbon layer may be patterned, e.g., patterned by photolithography.

Figure 3C:
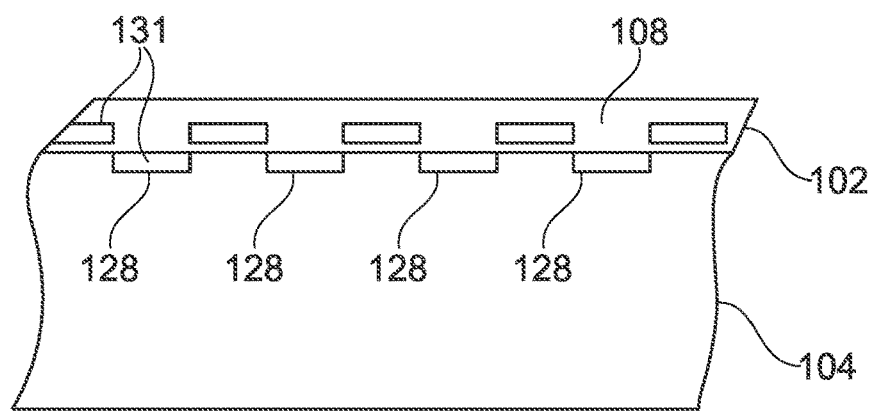

Referring to FIG. 3C, the carbon structure 102 may also be formed by a plurality of carbon layers stacked over each other along a vertical direction perpendicular to the first surface 106, wherein each of the plurality of carbon layers comprises a plurality of carbon regions 131 laterally spaced from one another. In the exemplary view of FIG. 3C two patterned carbon layers are shown for illustrative purposes although a different number of patterned carbon layers may be used. In some examples, the carbon regions 131 of the different carbon layers are surrounded by different materials, e.g., first carbon regions being arranged in the handle substrate 104 and second carbon regions being arranged in the adhesion layer 108. In some other embodiments, the carbon regions of different carbon layers may also be arranged in the same material, e.g., in the handle substrate 104, and/or in the adhesion layer 108 on the handle substrate 104, and/or in another adhesion layer on the semiconductor substrate 112, for example. Further details on forming the carbon structure are given in the examples above.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that the present disclosure be limited only by the claims and the equivalents thereof.

What is claimed is:

1. A method of manufacturing a semiconductor device, the method comprising:
   forming a carbon structure on a handle substrate at a first surface of the handle substrate;
   attaching a first surface of a semiconductor substrate to the first surface of the handle substrate;
   processing the semiconductor substrate; and
   performing a separation process, comprising modifying the carbon structure, to separate the handle substrate from the semiconductor substrate,
   wherein at least one of:
      the modifying the carbon structure comprises at least partially destroying the carbon structure;
      the modifying the carbon structure comprises forming one or more cracks in the carbon structure; or
      after the modifying the carbon structure, a first surface of one or more portions of the carbon structure that remain on the handle substrate are exposed.

2. The method of claim 1, wherein the forming the carbon structure comprises:
forming trenches in the handle substrate at the first surface of the handle substrate; and
filling the trenches at least partially with carbon.

3. The method of claim 2, wherein:
a depth of the trenches ranges from 50 nanometers (nm) to 1000 nm; and
a lateral distance between two adjacent trenches of the trenches ranges from 20 nm to 200 nm.

4. The method of claim 1, wherein the forming the carbon structure comprises at least one of:
heating the handle substrate up to at least 900° Celsius in an inert atmosphere or vacuum;
heating a surface part of the handle substrate by absorption of laser radiation; or
carbonizing a resist formed on the handle substrate.

5. The method of claim 1, wherein the forming the carbon structure comprises:
forming a plurality of carbon layers stacked over each other along a vertical direction perpendicular to the first surface of the handle substrate, wherein:
each carbon layer of the plurality of carbon layers comprises a plurality of carbon regions laterally spaced from one another, and
a degree of coverage of the first surface of the handle substrate with carbon regions of the plurality of carbon layers is greater than 90%.

6. The method of claim 1, wherein:
the forming the carbon structure comprises forming a carbon layer over the first surface of the handle substrate; and
the carbon layer covers the first surface of the handle substrate.

7. The method of claim 1, comprising:
forming an adhesion layer over at least one of the first surface of the semiconductor substrate or the first surface of the handle substrate, wherein the adhesion layer has a melting point above 1800° Celsius.

8. The method of claim 7, comprising:
forming trenches in the adhesion layer; and
filling the trenches at least partially with carbon.

9. The method of claim 1, wherein the attaching the first surface of the semiconductor substrate to the first surface of the handle substrate comprises wafer bonding.

10. The method of claim 1, wherein:
the processing the semiconductor substrate comprises separating a separation part of the semiconductor substrate from a transfer part of the semiconductor substrate; and
the transfer part of the semiconductor substrate remains attached to the handle substrate while the separation part is separated.

11. The method of claim 10, comprising:
before the attaching the first surface of the semiconductor substrate to the first surface of the handle substrate, modifying a crystal structure of the semiconductor substrate at an interface between the separation part and the transfer part of the semiconductor substrate by at least one of:
ion implantation of impurities and heating; or
absorption of laser radiation.

12. The method of claim 10, comprising:
forming one or more semiconductor layers on the transfer part of the semiconductor substrate;
forming semiconductor device elements at a first side of the one or more semiconductor layers; and
attaching the one or more semiconductor layers to a support carrier via the first side.

13. The method of claim 1, wherein the modifying the carbon structure is caused by absorption of laser radiation.

14. The method of claim 1, wherein the separation process comprises heating the handle substrate.

15. The method of claim 1, wherein the modifying the carbon structure comprises at least partially destroying the carbon structure.

16. The method of claim 1, wherein the modifying the carbon structure comprises forming the one or more cracks in the carbon structure.

17. The method of claim 1, wherein after the modifying the carbon structure, the first surface of the one or more portions of the carbon structure that remain on the handle substrate are exposed.

18. The method of claim 1, wherein the separation process comprises at least one of applying at least one of mechanical force or stress to the handle substrate or performing ultrasonic treatment of the handle substrate.

19. A method of manufacturing a semiconductor device, the method comprising:
forming a material structure on a handle substrate at a first surface of the handle substrate, wherein the material structure comprises a plurality of material regions laterally spaced from one another;
attaching a first surface of a semiconductor substrate to the first surface of the handle substrate;
processing the semiconductor substrate; and
performing a separation process to separate the handle substrate from the semiconductor substrate, wherein the separation process comprises modifying the material structure,
wherein at least one of:
the modifying the material structure comprises at least partially destroying the material structure;
the modifying the material structure comprises forming one or more cracks in the material structure; or
after the modifying the material structure, a first surface of one or more portions of the material structure that remain on the handle substrate are exposed.

20. The method of claim 19, wherein the material structure comprises at least one of carbon, a ternary carbide, or a ternary nitride.

21. The method of claim 19, wherein the semiconductor substrate is a silicon carbide substrate.

22. A method of manufacturing a semiconductor device, the method comprising:
forming a carbon structure on a handle substrate at a first surface of the handle substrate, wherein the forming the carbon structure comprises:
forming trenches in the handle substrate at the first surface of the handle substrate; and
filling the trenches at least partially with carbon;
attaching a first surface of a semiconductor substrate to the first surface of the handle substrate;
processing the semiconductor substrate; and
performing a separation process, comprising modifying the carbon structure, to separate the handle substrate from the semiconductor substrate.

23. A method of manufacturing a semiconductor device, the method comprising:
forming a carbon structure on a handle substrate at a first surface of the handle substrate;
forming an adhesion layer over at least one of a first surface of a semiconductor substrate or the first surface of the handle substrate;

forming trenches in the adhesion layer;
filling the trenches at least partially with carbon;
attaching the first surface of the semiconductor substrate to the first surface of the handle substrate;
processing the semiconductor substrate; and
performing a separation process, comprising modifying the carbon structure, to separate the handle substrate from the semiconductor substrate.

\* \* \* \* \*